(12) United States Patent
Kobune et al.

(10) Patent No.: US 11,545,413 B2
(45) Date of Patent: Jan. 3, 2023

(54) THERMAL CONDUCTION SHEET AND HEAT DISSIPATING DEVICE INCLUDING THERMAL CONDUCTION SHEET

(71) Applicant: Hitachi Chemical Company, Ltd., Tokyo (JP)

(72) Inventors: Mika Kobune, Tokyo (JP); Michiaki Yajima, Tokyo (JP)

(73) Assignee: Showa Denko Materials Co., Ltd., Tokyo (JP)

( * ) Notice: Subject to any disclaimer, the term of this patent is extended or adjusted under 35 U.S.C. 154(b) by 96 days.

(21) Appl. No.: 16/970,156

(22) PCT Filed: Feb. 16, 2018

(86) PCT No.: PCT/JP2018/005589
§ 371 (c)(1),
(2) Date: Aug. 14, 2020

(87) PCT Pub. No.: WO2019/159340
PCT Pub. Date: Aug. 22, 2019

(65) Prior Publication Data
US 2020/0402886 A1    Dec. 24, 2020

(51) Int. Cl.
*H01L 23/373* (2006.01)
*H05K 7/20* (2006.01)
*F28F 21/02* (2006.01)
*F28F 13/00* (2006.01)

(52) U.S. Cl.
CPC .......... *H01L 23/3733* (2013.01); *F28F 21/02* (2013.01); *H05K 7/20481* (2013.01); *F28F 2013/006* (2013.01)

(58) Field of Classification Search
CPC . F28F 21/02; F28F 2013/006; H01L 23/3733; H05K 7/20481
See application file for complete search history.

(56) References Cited

FOREIGN PATENT DOCUMENTS

| | | | |
|---|---|---|---|
| CN | 107501673 A | * 12/2017 | ............... C08K 3/04 |
| JP | H05-247268 A | 9/1993 | |
| JP | H10-298433 A | 11/1998 | |
| JP | 2006-306068 A | 11/2006 | |
| JP | 2010132866 A | * 6/2010 | |

(Continued)

*Primary Examiner* — Devon Russell
(74) *Attorney, Agent, or Firm* — Fitch, Even, Tabin & Flannery, LLP

(57) ABSTRACT

Provided is a thermal conduction sheet, including graphite particles (A) of at least one kind selected from the group consisting of flake-shaped particles, ellipsoidal particles, and rod-shaped particles, in which: when the graphite particles (A) are flake-shaped particles, a planar direction of the graphite particles (A) is oriented in a thickness direction of the thermal conduction sheet, when the graphite particles (A) are ellipsoidal particles, a major axis direction of the graphite particles (A) is oriented in the thickness direction of the thermal conduction sheet, when the graphite particles (A) are rod-like particles, a longitudinal direction of the graphite particles (A) is oriented in the thickness direction of the thermal conduction sheet, the thermal conduction sheet has an elastic modulus of 1.4 MPa or less under a compression stress of 0.1 MPa at 150° C., and the thermal conduction sheet has a tack strength of 5.0 N·mm or higher at 25° C.

20 Claims, 2 Drawing Sheets

(56) References Cited

FOREIGN PATENT DOCUMENTS

| | | | |
|---|---|---|---|
| JP | 4743344 B | | 8/2011 |
| JP | 2012-038763 A | | 2/2012 |
| JP | 5316254 B | | 10/2013 |
| JP | 2014-027144 A | | 2/2014 |
| JP | 2017079264 A | * | 4/2017 |
| JP | 2017-126614 A | | 7/2017 |
| JP | 2017126614 A | * | 7/2017 |
| JP | 2018-014534 A | | 1/2018 |
| TW | 200934826 A | * | 8/2009 .............. C08L 83/04 |

\* cited by examiner

THERMAL CONDUCTION SHEET AND HEAT DISSIPATING DEVICE INCLUDING THERMAL CONDUCTION SHEET

CROSS-REFERENCE TO RELATED APPLICATIONS

This application is a U.S. national phase application filed under 35 U.S.C. § 371 of International Application No. PCT/JP2018/005589, filed Feb. 16, 2018, designating the United States, the entire contents of which are hereby incorporated herein by reference.

TECHNICAL FIELD

The present invention relates to a thermal conduction sheet, and a heat dissipating device including the thermal conduction sheet.

BACKGROUND ART

In recent years, in conjunction with the increasing wiring density of multilayer wiring boards, increasing wiring density in semiconductor packages, increasing mounting density of electronic components, and increasing heat generation per unit area due to the increased integration of semiconductor devices and the like, improved heat dissipation has been desired for semiconductor devices.

Commonly used semiconductor packages such as central processing units (CPUs) have a configuration in which a thermally conductive material, such as a thermal conduction sheet or grease, is disposed between a heat generating element such as a semiconductor chip and a heat dissipating element made of aluminum, copper or the like, and tightly adhered thereto, to allow heat dissipation.

To improve the heat dissipation property, thermal conduction sheets are required to have high thermal conductivity. For the purpose of improving the thermal conductivity of a thermal conduction sheet, a variety of thermally conductive composite material compositions and molded articles thereof, in which graphite powder having a high thermal conductivity is blended in a matrix material, have been proposed.

For example, Patent Document 1 discloses a rubber composition containing artificial graphite having a particle size of from 1 μm to 20 μm. Patent Document 2 discloses a silicone rubber composition containing, as a filler, a spherical graphite having a crystalline interplanar spacing of 0.33 nm to 0.34 nm.

Further, Patent Document 3 discloses a heat dissipation sheet in which anisotropic graphite powder is oriented in a specific direction in a binder component thereby improving the heat dissipation property. Moreover, Patent Document 4 discloses a thermal conduction sheet in which graphite particles are oriented in the thickness direction of the thermal conduction sheet to improve the thermal conductivity.

RELATED ART DOCUMENTS

Patent Documents

[Patent Document 1] Japanese Patent Application Laid-Open (JP-A) No. H05-247268
[Patent Document 2] JP-A No. H10-298433
[Patent Document 3] Japanese Patent No. 4743344
[Patent Document 4] Japanese Patent No. 5316254

SUMMARY OF INVENTION

Technical Problem

Meanwhile, to ensure heat dissipation from the heat generating element, thermal conduction sheets are also required to be capable of adjusting to any thermal deformation (warpage) of the members. In particular, in recent years, in conjunction with improvements in package performance, the sizes of the packages and the chips have been increasing. Since these increases in size lead to further increases in the amount of warpage in the packages, conventional thermal conduction sheets tend not to be able to adjust to warpage and, therefore, they are more susceptible to becoming detached from the heat generating element and the heat dissipating element. In addition, for example, when a thermal conduction sheet is disposed between a semiconductor chip and a heat spreader, which are a heat generating element and a heat dissipating element, respectively, it is required that the thermal conduction sheet be adhered to the chip and the heat spreader tightly enough, to ensure heat dissipation.

For example, in the heat dissipation sheet disclosed in Patent Document 3, a thermoplastic rubber component and a thermosetting rubber component are used to improve flexibility and a tackiness that allows the heat dissipation sheet to adhere with an adherend, along with the properties required for a heat dissipation sheet such as heat resistance and strength. Further, in the thermal conduction sheet disclosed in Patent Document 4, a specific organic polymer compound and a curing agent are used as matrix materials to cross-link the organic polymer compound, in order to improve strength and flexibility. However, the methods disclosed in Patent Documents 3 and 4 have yet to be improved in terms of the adjustability to warpage of semiconductor packages in which the amount of warpage is increased.

The invention was made in view of such problems, and an object of the invention is to provide a thermal conduction sheet that is capable of ensuring heat dissipation by stably maintaining tight adhesion to a heat generating element and a heat dissipating element, and a heat dissipating device including the thermal conduction sheet.

Solution to Problem

Specific means for solving the above-described problems include the following aspects.
<1> A thermal conduction sheet, including graphite particles (A) of at least one kind selected from the group consisting of flake-shaped particles, ellipsoidal particles, and rod-shaped particles, in which:
when the graphite particles (A) are flake-shaped particles, a planar direction of the graphite particles (A) is oriented in a thickness direction of the thermal conduction sheet,
when the graphite particles (A) are ellipsoidal particles, a major axis direction of the graphite particles (A) is oriented in the thickness direction of the thermal conduction sheet,
when the graphite particles (A) are rod-like particles, a longitudinal direction of the graphite particles (A) is oriented in the thickness direction of the thermal conduction sheet,
the thermal conduction sheet has an elastic modulus of 1.4 MPa or less under a compression stress of 0.1 MPa at 150° C., and
the thermal conduction sheet has a tack strength of 5.0 N·mm or higher at 25° C.
<2> The thermal conduction sheet according to <1>, further including a component (B) that is a liquid at 25° C.
<3> The thermal conduction sheet according to <1> or <2>, in which the component (B) that is a liquid at 25° C. includes a polybutene.

<4> The thermal conduction sheet according to any one of <1> to <3>, further including an acrylate-based polymer (C).
<5> The thermal conduction sheet according to <4>, in which the acrylate-based polymer (C) has a glass transition temperature of 20° C. or lower.
<6> The thermal conduction sheet according to any one of <1> to <5>, further including an ethylene-α-olefin copolymer (D).
<7> The thermal conduction sheet according to any one of <1> to <6>, further including a hot-melt agent (E).
<8> The thermal conduction sheet according to any one of <1> to <7>, further including an antioxidant (F).
<9> The thermal conduction sheet according to any one of <1> to <8>, in which the graphite particles (A) include flake-shaped particles that include expandable graphite particles.
<10> The thermal conduction sheet according to any one of <1> to <9>, in which a content of the graphite particles (A) is from 15% by volume to 50% by volume.
<11> A heat dissipating device, including:
 a heat generating element;
 a heat dissipating element; and
 the thermal conduction sheet according to any one of <1> to <10>, which is arranged between the heat generating element and the heat dissipating element.

Advantageous Effects of Invention

According to the present disclosure, a thermal conduction sheet that is capable of ensuring heat dissipation by stably maintaining tight adhesion to a heat generating element and a heat dissipating element, and a heat dissipating device including the thermal conduction sheet are provided.

DESCRIPTION OF EMBODIMENTS

Figure 1:
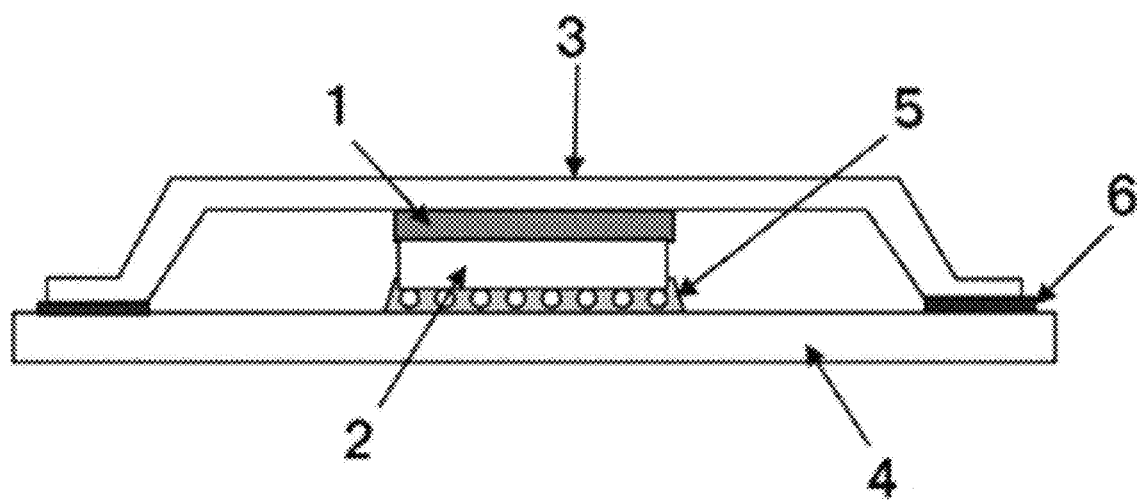
FIG. 1 is a schematic cross-sectional view of a heat dissipating device according to one embodiment of the invention, in which the heat generating element is a semiconductor chip, and the heat dissipating element is a heat spreader.

Embodiments for carrying out the invention will be described below in detail. However, the invention is not limited to the following embodiments. In the following embodiments, components (including elemental steps, etc.) thereof are not essential unless otherwise specified. The same applies to numerical values and ranges, which do not limit the invention.

In the present disclosure, the term "step" encompasses an independent step separated from other step(s) as well as a step that is not clearly separated from other step(s), as long as a purpose of the step can be achieved.

In the present disclosure, a numerical range described using "to" indicates a range including the numerical values before and after "to" as a minimum value and a maximum value, respectively.

In numerical ranges described herein in a stepwise manner, an upper limit value or a lower limit value described in one numerical range may be replaced with an upper limit value or a lower limit value of another numerical range described in a stepwise manner. In addition, in a numerical range described in the present disclosure, the upper limit value or the lower limit value of the numerical range may be replaced with a value described in the Examples section.

In the present disclosure, a component may include a plurality of different kinds of substances corresponding thereto. In a case in which there are a plurality of different kinds of substances corresponding to a component in a composition, a content or an amount of the component means the total content or amount of the plurality of different kinds of substances present in the composition, unless otherwise specified.

In the present disclosure, particles corresponding to a component may include a plurality of different kinds of particles. In a case in which there are a plurality of different kinds of particles corresponding to a component in a composition, a particle size of the component means a value for a mixture of the plurality of different kinds of particles present in the composition, unless otherwise specified.

In the disclosure, the term "layer" or "film" encompasses a case in which, when a region having the layer or the film is observed, the layer or the film is formed on the entire region, as well as a case in which the layer or the film is formed on only a part of the region.

In the disclosure, the term "layer" indicates stacking layers, in which case two or more layers may be bonded with each other or may be detachable from one another.

[Thermal Conduction Sheet]

A thermal conduction sheet according to the disclosure is a thermal conduction sheet including graphite particles (A) of at least one kind selected from the group consisting of flake-shaped particles, ellipsoidal particles, and rod-shaped particles (hereinafter, also simply referred to as "graphite particles (A)"), in which: when the graphite particles (A) are flake-shaped particles, a planar direction of the graphite particles (A) is oriented in a thickness direction of the thermal conduction sheet, when the graphite particles (A) are ellipsoidal particles, a major axis direction of the graphite particles (A) is oriented in the thickness direction of the thermal conduction sheet, when the graphite particles (A) are rod-like particles, a longitudinal direction of the graphite particles (A) is oriented in the thickness direction of the thermal conduction sheet, the thermal conduction sheet has an elastic modulus of 1.4 MPa or less under a compression stress of 0.1 MPa at 150° C., and the thermal conduction sheet has a tack strength of 5.0 N·mm or higher at 25° C.

It is presumed that the thermal conduction sheet according to the disclosure has excellent thermal conductivity in the thickness direction and exhibits a low thermal resistance since the graphite particles (A) are oriented in the thickness direction. It is also presumed that the thermal conduction sheet according to the disclosure is capable of adjusting to warpage thereby ensuring tight adhesion even when used in a package in which the amount of warpage is large since the thermal conduction sheet has an elastic modulus of 1.4 MPa or less under a compression stress of 0.1 MPa at 150° C., and a tack strength of 5.0 N·mm or higher at 25° C.

The thermal conduction sheet may further contain, for example, a component (B) that is a liquid at 25° C., an acrylate-based polymer (C), an ethylene-α-olefin copolymer (D), a hot-melt agent (E), and an antioxidant (F), and may contain other component(s). Materials used in the thermal conduction sheet according to the disclosure will be described below.

<Graphite Particles (A)>

The thermal conduction sheet contains graphite particles (A). It is presumed that the graphite particles (A) mainly function as a high-thermal-conductivity filler. The graphite particles (A) are at least one selected from the group consisting of flake-shaped particles, ellipsoidal particles, and rod-shaped particles. When the graphite particles (A) are flake-shaped particles, the planar direction of the graphite particles (A) is oriented in the thickness direction of the thermal conduction sheet; when the graphite particles (A) are ellipsoidal particles, the major axis direction of the graphite particles (A) is oriented in the thickness direction of the thermal conduction sheet; and when the graphite particles (A) are rod-shaped particles, the longitudinal direction of the graphite particles (A) is oriented in the thickness direction of the thermal conduction sheet. Further, when the graphite particles (A) are flake-shaped particles, the six-membered ring planes in a crystal are preferably oriented in the planar direction; when the graphite particles (A) are ellipsoidal particles, the six-membered ring planes in a crystal are preferably oriented in the major axis direction; and when the graphite particles (A) are rod-shaped particles, the six-membered ring planes in a crystal are preferably oriented in the longitudinal direction. A "six-membered ring plane" means a plain in which a six-membered ring is formed in a hexagonal system, and means a (0001) crystal plane.

The graphite particles (A) are more preferably flake-shaped. By choosing flake-shaped graphite particles, the thermal conductivity tends to be further improved. This is presumably because flake graphite particles become oriented more easily in a certain direction in the thermal conduction sheet.

Whether or not the six-membered ring planes in a crystal of the graphite particles (A) are oriented in the planar direction of flake-shaped particles, the major axis direction of ellipsoidal particles, or the longitudinal direction of rod-shaped particles, can be analyzed by an X-ray diffraction analysis. Specifically, the orientation direction of the six-membered ring planes in a crystal of the graphite particles (A) is verified by the following method.

First, a measurement sample sheet, in which the planar direction of flake-shaped particles, the major axis direction of ellipsoidal particles, or the longitudinal direction of rod-shaped particles of graphite particles (A) is oriented along the planar direction of the sheet, is prepared. Specific examples of the method of preparing the measurement sample sheet include the following method.

A sheet is prepared from a mixture containing a resin and graphite particles (A), the amount of the graphite particles (A) being 10% by volume or more with respect to the resin. The "resin" used in this process may be any material which does not cause a peak that would hinder X-ray diffraction and which is capable of forming a sheet. Specific examples that can be used include an amorphous resin that is cohesive to be used as a binder, such as an acrylic rubber, an acrylonitrile-butadiene rubber (NBR) or a styrene-isobutylene-styrene copolymer (SIBS).

The sheet obtained from the mixture is pressed to a thickness of one-tenth or less of the original thickness. Plural of these pressed sheets are layered to form a laminate. The laminate is further compressed to a thickness of one tenth or less, and the above processes are repeated at least three times to obtain a measurement sample sheet. By the above processes, the graphite particles (A) in the obtained measurement sample sheet become oriented such that the planar direction in the case of flake-shaped particles, the major axis direction in the case of ellipsoidal particles, or the longitudinal direction in the case of rod-shaped particles, is oriented along the planar direction of the measurement sample sheet.

The surface of the measurement sample sheet prepared in the above-described manner is subjected to an X-ray diffraction analysis. The height $H_1$ of a peak that appears in the vicinity of $2\theta=77°$, which corresponds to the (110) plane of graphite, and the height $H_2$ of a peak that appears in the vicinity of $2\theta=27°$, which corresponds to the (002) plane of graphite, are measured. In the measurement sample sheet prepared in the above-described manner, the value obtained by dividing $H_1$ by $H_2$ is from 0 to 0.02.

Accordingly, the phrase "the six-membered ring planes in a crystal of the graphite particles (A) is oriented in the planar direction in a case of flake-shaped particles, the major axis direction in a case of ellipsoidal particles, or the longitudinal direction in a case of rod-shaped particles" refers to a state in which, when an X-ray diffraction analysis is performed on a surface of a sheet containing the graphite particles (A), a value obtained by dividing the height of a peak that appears in the vicinity of $2\theta=77°$, which corresponds to the (110) plane of the graphite particles (A), by the height of a peak that appears in the vicinity of $2\theta=27°$, which corresponds to the (002) plane of the graphite particles (A), is from 0 to 0.02.

The conditions of the X-ray diffraction analysis in the disclosure are as follows.

Apparatus: for example, "D8 DISCOVER" manufactured by Bruker AXS GmbH

X-ray source: CuKα having a wavelength of 1.5406 nm, 40 kV, 40 mA

Step (measurement step size): 0.01°

Step time: 720 sec.

The description "when the graphite particles (A) are flake-shaped particles, a planar direction of the graphite particles (A) is oriented in a thickness direction of the thermal conduction sheet, when the graphite particles (A) are ellipsoidal particles, a major axis direction of the graphite particles (A) is oriented in the thickness direction of the thermal conduction sheet, when the graphite particles (A) are rod-like particles, a longitudinal direction of the graphite particles (A) is oriented in the thickness direction of the thermal conduction sheet" means that an angle formed by the surface (main face) of the thermal conduction sheet and the planar direction in the case of flake-shaped particles, the major axis direction in the case of ellipsoidal particles, or the longitudinal direction in the case of rod-shaped particles (this angle is hereinafter also referred to as "orientation angle"), is 60° or greater. The orientation angle is preferably 80° or greater, more preferably 85° or greater, and still more preferably 88° or greater.

The orientation angle is determined by observing a cross-section of the thermal conduction sheet under a scanning electron microscope (SEM), measuring the angle (orientation angle) that is formed by the surface (main face) of the thermal conduction sheet and the planar direction in the case of flake-shaped particles, the major axis direction in the case of ellipsoidal particles, or the longitudinal direction in the case of rod-shaped particles, for random 50 graphite particles (A), and taking the average of the measured values.

The particle size of the graphite particles (A) is not particularly restricted. The average particle size of the graphite particles (A) is, in terms of mass-average particle size, preferably from one-half of the average thickness of the thermal conduction sheet to equal to the average thickness of the thermal conduction sheet. When the mass-average particle size of the graphite particles (A) is one-half of the average thickness of the thermal conduction sheet or greater, efficient thermal conduction paths are formed in the thermal conduction sheet, whereby the thermal conductivity tends to be improved. When the mass-average particle size of the graphite particles (A) is equal to or less than the average thickness of the thermal conduction sheet, protrusions of the graphite particles (A) can be reduced, whereby favorable adhesiveness at the surface of the thermal conduction sheet tends to be achieved.

The method of producing a thermal conduction sheet that is configured such that the planar direction of flake-shaped particles, the major axis direction of ellipsoidal particles, or the longitudinal direction of rod-shaped particles is oriented in the thickness direction of the thermal conduction sheet is not particularly restricted and, for example, a method described in JP-A No. 2008-280496 may be employed. Specifically, a method may be employed in which a sheet is prepared from a composition, which is subsequently layered with other such sheets to produce a laminate, after which a side face of the laminate is sliced off (e.g., at an angle of from 0° to 30° with respect to a normal line extending from the main face of the laminate; this method is hereinafter also referred to as a "layer-slice method").

When the layer-slice method is employed, the particle size of the graphite particles (A) used as a raw material is, in terms of mass-average particle size, preferably one-half of the average thickness of the resulting thermal conduction sheet or greater, and may be larger than the average thickness of the thermal conduction sheet. The particle size of the graphite particles (A) used as a raw material may be larger than the average thickness of the resulting thermal conduction sheet because, for example, the thermal conduction sheet is produced by slicing a laminate together with the graphite particles (A) and consequently the graphite particles (A) do not protrude from the surface of the resulting thermal conduction sheet even when the graphite particles (A) having a particle size of larger than the average thickness of the resulting thermal conduction sheet are contained. Further, when the graphite particles are sliced together as described above, a large number of graphite particles (A) penetrating through the resulting thermal conduction sheet in the thickness direction are generated, whereby extremely efficient thermal conduction paths are formed, and the thermal conductivity tends to be further improved.

When the layer-slice method is employed, the particle size of the graphite particles (A) used as a raw material is, in terms of mass-average particle size, more preferably from 1-fold to 5-fold, still more preferably from 2-fold to 4-fold, of the average thickness of the resulting thermal conduction sheet. When the mass-average particle size of the graphite particles (A) is 1-fold or more of the average thickness of the resulting thermal conduction sheet, more efficient thermal conduction paths are formed, whereby the thermal conductivity is further improved. When the mass-average particle size of the graphite particles (A) is 5-fold or less of the average thickness of the resulting thermal conduction sheet, the area occupied by the graphite particles (A) at the surface of the thermal conduction sheet does not become excessively large, whereby deterioration of the adhesiveness can be suppressed.

The mass-average particle size (D50) of the graphite particles (A) is measured using a laser diffraction-type particle size distribution analyzer that utilizes a laser diffraction-scattering method (e.g., "MICROTRAC Series MT3300" manufactured by Nikkiso Co., Ltd.), and corresponds to a particle size at which the cumulative weight reaches 50% on a weight-cumulative particle size distribution curve drawn from the side of smaller particle sizes.

The thermal conduction sheet may also include graphite particles other than flake-shaped, ellipsoidal or rod-shaped graphite particles, and may include spherical graphite particles, artificial graphite particles, exfoliated graphite particles, acid-treated graphite particles, expandable graphite particles, or carbon fiber flakes.

The graphite particles (A) are preferably flake-shaped particles and, from the viewpoint of ease of obtaining scale(flake)-shaped particles having a high degree of crystallization and large particle sizes, flake-shaped expandable graphite particles obtained by pulverizing a sheet-formed expandable graphite are preferred.

From the viewpoint of, for example, the balance between thermal conductivity and adhesiveness, the content of the graphite particles (A) in the thermal conduction sheet is preferably from 15% by volume to 50% by volume, more preferably from 20% by volume to 45% by volume, and still more preferably from 25% by volume to 40% by volume.

When the content of the graphite particles (A) is 15% by volume or higher, the thermal conductivity tends to be improved. Meanwhile, when the content of the graphite particles (A) is 50% by volume or lower, deterioration of tackiness and adhesiveness tends to be suppressed.

When the thermal conduction sheet contains graphite particles other than flake-shaped, ellipsoidal or rod-shaped graphite particles, it is preferable that the content of the entire graphite particles is in the above-described range.

The content (% by volume) of the graphite particles (A) is a value determined by the following equation.

Content (% by volume) of graphite particles $(A)=$
$[(Aw/Ad)/\{(Aw/Ad)+(Xw/Xd)\}]\times 100$ Aw: Mass composition of graphite particles (A) (% by mass)

Xw: Mass composition of the other optional components (% by mass)

Ad: Density of graphite particles (A) (in the disclosure, calculation is made assuming that Ad is 2.1)

Xd: Density of the other optional components

<Component (B) that is a Liquid at 25° C.>

The thermal conduction sheet according to the disclosure may include a component that is a liquid at 25° C. (hereinafter, also referred to as a "liquid component (B)"). In the disclosure, the phrase "liquid at 25° C." indicates a substance that exhibits fluidity and viscous property at 25° C., and has a viscosity, which is an indicator of the viscous property, of from 0.0001 Pa·s to 1,000 Pa·s at 25° C. In the disclosure, the term "viscosity" is defined as a value measured at 25° C. using a rheometer at a shear rate of 5.0 s$^{-1}$. In more detail, the "viscosity" is measured at a temperature of 25° C. in terms of shear viscosity using a rotational shear viscometer equipped with a cone plate (diameter: 40 mm, cone angle: 0°).

The viscosity of the liquid component (B) at 25° C. is preferably from 0.001 Pa·s to 100 Pa·s, and more preferably from 0.01 Pa·s to 10 Pa·s.

The liquid component (B) is not particularly restricted as long as it is a liquid at 25° C., and the liquid component (B) is preferably a polymer. Examples of the liquid component (B) include a polybutene, a polyisoprene, a polysulfide, an acrylonitrile rubber, a silicone rubber, a hydrocarbon resin, a terpene resin, and an acrylic resin. In particular, from the viewpoint of heat resistance, the liquid component (B)

preferably includes a polybutene. The liquid component (B) may be used singly, or two or more kinds thereof may be used in combination.

A "polybutene" refers to a polymer obtained by polymerizing isobutene or n-butene, and encompasses a polymer obtained by copolymerizing isobutene and n-butene. As for the structure, the "polybutene" refers to a polymer having a structural unit represented by "—$CH_2$—$C(CH_3)_2$—" or "—$CH_2$—$CH(CH_2CH_3)$—", and may sometimes be referred to as "polyisobutylene". As long as the polybutene contains the above-described structure, there is no other limitation to the structure of the polybutene.

Examples of the polybutene include a butene homopolymer and a copolymer of buten and other monomer component(s). Examples of the copolymer of butene and other monomer component(s) include at least one selected from a copolymer of isobutene and styrene or a copolymer of isobutene and ethylene. The copolymer may be any of a random copolymer, a block copolymer, or a graft copolymer.

Examples of the polybutene also include "NOF Polybutene™ EMAWET (registered trademark)" manufactured by NOF Corporation, "NISSEKI POLYBUTENE" manufactured by JXTG Nippon Oil and Energy Corporation, "TETRAX" manufactured by JXTG Nippon Oil and Energy Corporation, "HIMOL" manufactured by JXTG Nippon Oil and Energy Corporation, and "POLYISOBUTYLENE" manufactured by TOMOE Engineering Co., Ltd.

It is presumed that the liquid component (B) mainly functions as, for example, both a stress relaxation agent and tackifier having excellent heat resistance and humidity resistance. Further, by using the liquid component (B) in combination with the hot-melt agent (E) described below, cohesive strength as well as flowability upon heating tends to be further improved.

In the thermal conduction sheet, the content of the liquid component (B) is preferably from 10% by volume to 55% by volume, more preferably from 15% by volume to 50% by volume, and still more preferably from 20% by volume to 50% by volume, from the viewpoint of further improving tack strength, adhesiveness, sheet strength, hydrolysis resistance and the like.

When the content of the liquid component (B) is 10% by volume or more, the tack strength and adhesiveness tend to be further improved. When the content of the liquid component (B) is 55% by volume or less, reductions in sheet strength and thermal conductivity tends to be more effectively controlled.

<Acrylate-Based Polymer (C)>

The thermal conduction sheet may further contain an acrylate-based polymer (C). It is presumed that the acrylate-based polymer (C) mainly functions as, for example, both a tackifier and elasticity-imparting agent that restores the thickness of the thermal conduction sheet such that the thermal conduction sheet can adjust to warpage.

Examples of the acrylate-based polymer (C) that may be preferably used includes an acrylate-based polymer (so-called acrylic rubber) obtained from a main material component such as butyl acrylate, ethyl acrylate, acrylonitrile, acrylic acid, glycidyl methacrylate, 2-ethylhexyl acrylate or the like, which may be copolymerized with methyl acrylate or the like as necessary. The acrylate-based polymer (C) may be used singly, or two or more kinds thereof may be used in combination.

The acrylate-based polymer (C) has a weight-average molecular weight of preferably from 100,000 to 1,000,000, more preferably from 250,000 to 700,000, and still more preferably from 400,000 to 600,000. When the weight-average molecular weight is 100,000 or more, excellent film strength tends to be attained, while when the weight-average molecular weight is 1,000,000 or less, excellent flexibility tends to be attained.

The weight-average molecular weight can be determined by gel permeation chromatography based on a calibration curve of standard polystyrene.

The acrylate-based polymer (C) has a glass transition temperature (Tg) of preferably 20° C. or lower, more preferably from −70° C. to 0° C., and still more preferably from −50° C. to −20° C. When the glass transition temperature is 20° C. or lower, excellent flexibility and excellent tackiness tend to be attained.

The glass transition temperature (Tg) can be calculated from tan δ derived from a dynamic mechanical analysis (tensile mode).

The acrylate-based polymer (C) may be distributed throughout the thermal conduction sheet by internally blending the acrylate-based polymer (C), or may be localized at a surface by coating or impregnating the surface with the acrylate-based polymer (C). In particular, from the viewpoint of obtaining a sheet with excellent ease of handling, it is preferable that one side of the thermal conduction sheet is coated or impregnated with the acrylate-based polymer (C), since a strong tackiness can be imparted to one side only.

<Ethylene-α-Olefin Copolymer (D)>

The thermal conduction sheet may further contain an ethylene-α-olefin copolymer (D). The ethylene-α-olefin copolymer (D) presumably functions as, for example, an elasticity-imparting agent that restores the thickness such that the thermal conduction sheet can adjust to warpage.

The ethylene-α-olefin copolymer (D) may be any copolymer of ethylene and an α-olefin, and the copolymerization ratio of ethylene and the α-olefin is not particularly restricted. Examples of the α-olefin include propylene, 1-butene, 1-hexene, and 1-octene. The ethylene-α-olefin copolymer (D) may be used singly, or two or more kinds thereof may be used in combination.

The molecular weight of the ethylene-α-olefin copolymer (D) is not particularly restricted. The melt mass flow rate (MFR) of the ethylene-α-olefin copolymer (D) is preferably from 1 g/10 min to 50 g/10 min, more preferably from 5 g/10 min to 50 g/10 min, and still more preferably from 20 g/10 min to 40 g/10 min. When the melt mass flow rate (MFR) is 1 g/10 min or higher, favorable flowability tends to be obtained, the compressive elastic modulus of the thermal conduction sheet at 150° C. tends not to be excessively high, and favorable flexibility under high temperature tends to be maintained. When the melt mass flow rate (MFR) is 50 g/10 min or lower, flowability tends not to be excessively high, and improved ease of handling tends be obtained. Unless otherwise specified, the term "melt mass flow rate (MFR)" used herein means a melt mass flow rate (MFR) measured at a temperature of 190° C. at a load of 2.16 kg. The melt mass flow rate (MFR) is identical to "melt index", and serves as an indicator of the molecular weight of the ethylene-α-olefin copolymer (D). The method of measuring the melt mass flow rate (MFR) is described in JIS K7210:1999.

Examples of the ethylene-α-olefin copolymer (D) that is commercially available include a polyolefin elastomer "ENGAGE" manufactured by The Dow Chemical Company, "EOR8407" manufactured by The Dow Chemical Company, "ESPRENE SPO" manufactured by Sumitomo Chemical Co., Ltd., "EXCELLEN FX" manufactured by Sumitomo Chemical Co., Ltd., "EXCELLEN VL" manufactured by Sumitomo Chemical Co., Ltd., "NEO-ZEX" manufactured by Prime Polymer Co., Ltd., "EVOLUE"

manufactured by Prime Polymer Co., Ltd., and "LUCANT HC-3000X" manufactured by Mitsui Chemicals, Inc.

From the viewpoint of, for example, imparting favorable elasticity, the content of the ethylene-α-olefin copolymer (D) in the thermal conduction sheet is preferably from 2% by volume to 20% by volume, and more preferably from 3% by volume to 10% by volume. When the content of the ethylene-α-olefin copolymer (D) is 20% by volume or lower, the thermal conduction sheet tends not to be overly hard, and increases in elasticity tend to be suppressed.

<Hot-Melt Agent (E)>

The thermal conduction sheet may further include a hot-melt agent (E). The hot-melt agent exerts effects of enhancing the strength of the thermal conduction sheet and improving the flowability of the thermal conduction sheet upon heating.

Examples of the hot-melt agent (E) include an aromatic petroleum resin, a terpene phenol resin, and a cyclopentadiene-based petroleum resin. The hot-melt agent (E) may be a hydrogenated aromatic petroleum resin or a hydrogenated terpene phenol resin. The hot-melt agent (E) may be used singly, or two or more kinds thereof may be used in combination.

In particular, when a polybutene is used as the liquid component (B), it is preferable that the hot-melt agent (E) contains at least one selected from the group consisting of a hydrogenated aromatic petroleum resin and a hydrogenated terpene phenol resin. Such a hot-melt agent (E) is highly stable and has excellent compatibility with polybutenes, and therefore, when used to form a thermal conduction sheet, superior thermal conductivity, flexibility, and ease of handling tend to be achieved.

Examples of a commercially available hydrogenated aromatic petroleum resin include "ARKON" manufactured by Arakawa Chemical Industries, Ltd., and "I-MARV" manufactured by Idemitsu Kosan Co., Ltd. Examples of a commercially available hydrogenated terpene phenol resin include "CLEARON" manufactured by Yasuhara Chemical Co., Ltd. Further, examples of a commercially available cyclopentadiene-based petroleum resin include "QUINTONE" manufactured by Zeon Corporation, and "MARUKAREZ" manufactured by Maruzen Petrochemical Co., Ltd.

The hot-melt agent (E) is a solid at 25° C. and has a softening temperature of preferably from 40° C. to 150° C. When a thermoplastic resin is used as a hot-melt agent (E), the softening flowability upon thermocompression bonding tends to be increased, as a result of which the adhesiveness tends to be improved. Further, when the softening temperature is 40° C. or higher, the cohesive strength at around room temperature tends to be maintained, as a result of which an intended sheet strength is likely to be obtained, and excellent ease of handling tends to be attained. When the softening temperature is 150° C. or lower, softening flowability upon thermocompression bonding tends to be increased, as a result of which adhesiveness tends to be improved. The softening temperature is more preferably from 60° C. to 120° C. The softening temperature is determined by a ring-and-ball method (JIS K2207:1996).

From the viewpoint of improving adhesive strength, adhesiveness, sheet strength and the like, the content of the hot-melt agent (E) in the thermal conduction sheet is preferably from 3% by volume to 25% by volume, more preferably from 5% by volume to 20% by volume, and still more preferably from 5% by volume to 15% by volume.

When the content of the hot-melt agent (E) is 3% by volume or higher, adhesive strength, heat flowability, sheet strength or the like tend to be sufficient, while when the content of the hot-melt agent (E) is 25% by volume or lower, sufficient flexibility tends to be obtained thereby achieving favorable ease of handling and favorable thermal cycle resistance.

<Antioxidant (F)>

The thermal conduction sheet may include an antioxidant (F) for the purpose of, for example, imparting thermal stability at high temperature. Examples of the antioxidant (F) include a phenolic antioxidant, a phosphorus-based antioxidant, an amine-based antioxidant, a sulfur-based antioxidant, a hydrazine-based antioxidant, and an amide-based antioxidant. The antioxidant (F) may be selected as appropriate in accordance with the temperature conditions employed and the like, and is more preferably a phenolic antioxidant. The antioxidant (F) may be used singly, or two or more kinds thereof may be used in combination.

Examples of a commercially available phenolic antioxidant include ADK STAB AO-50, ADK STAB AO-60, and ADK STAB AO-80, manufactured by ADEKA Corporation.

The content of the antioxidant (F) in the thermal conduction sheet is not particularly restricted, and is preferably from 0.1% by volume to 5% by volume, more preferably from 0.2% by volume to 3% by volume, and still more preferably from 0.3% by volume to 1% by volume. When the content of the antioxidant (F) is 0.1% by volume or more, a sufficient antioxidation effect tends to be obtained. When the content of the antioxidant (F) is 5% by volume or less, reductions in the strength of the thermal conduction sheet tend to be suppressed.

<Other Components>

The thermal conduction sheet may further contain component(s) other than the graphite particles (A), the liquid component (B), the acrylate-based polymer (C), the ethylene-α-olefin copolymer (D), the hot-melt agent (E), and the antioxidant (F), in accordance with the intended purpose. For example, the thermal conduction sheet may include a flame retardant for the purpose of imparting flame retardancy. The flame retardant is not particularly restricted, and may be selected as appropriate from commonly used flame retardants. Examples of the flame retardant include a red phosphorus-based flame retardant and a phosphate-based flame retardant. In particular, a phosphate-based flame retardant is preferable from the viewpoints of excellent safety and improved adhesiveness due to the plasticization effect.

Examples of the red phosphorus-based flame retardant that may be used include a pure red phosphorus particles as well as those having various coatings for the purpose of improving safety or stability, and those produced as a masterbatch. Specific examples include Nova Red, Nova Excel, Nova Quel, and Nova Pellet (all of them are trade names) manufactured by Rin Kagaku Kogyo Co., Ltd.

Examples of the phosphate-based flame retardant include: an aliphatic phosphate such as trimethyl phosphate, triethyl phosphate, or tributyl phosphate; an aromatic phosphate such as triphenyl phosphate, tricresyl phosphate, cresyl diphenyl phosphate, trixylenyl phosphate, cresyl-di-2,6-xylenyl phosphate, tris(t-butylphenyl) phosphate, tris(isopropylated phenyl) phosphate, or isopropylated triaryl phosphate; and an aromatic condensed phosphate such as resorcinol bis-diphenyl phosphate, bisphenol A-bis(diphenyl phosphate), or resorcinol bis-dixylenyl phosphate.

In particular, bisphenol A-bis(diphenyl phosphate) is preferable, since it has excellent hydrolysis resistance and exerts an excellent effect of improving adhesiveness by its plasticization effect.

The content of the flame retardant in the thermal conduction sheet is not restricted, and the flame retardant may be used in an amount that can exert its flame retardancy. The content of the flame retardant is preferably about 30% by volume or lower and, from the viewpoint of suppressing the deterioration of thermal resistance due to bleeding of the component(s) of the flame retardant to the surface of the thermal conduction sheet, the content of the flame retardant is preferably 20% by volume or lower.

The average thickness of the thermal conduction sheet is not particularly restricted, and may be determined as appropriate in accordance with the purposes. The thickness of the thermal conduction sheet may be determined as appropriate in accordance with, for example, the specifications of the semiconductor package for which the thermal conduction sheet is to be used. The smaller the thickness is, the lower the thermal resistance tends to be, while the greater the thickness is, the more the adjustability to warpage tends to improve. The average thickness of the thermal conduction sheet may be from 50 μm to 3,000 μm and, from the viewpoints of thermal conductivity and adhesiveness, the average thickness of the thermal conduction sheet is preferably from 100 μm to 500 μm, and more preferably from 200 to 400 μm. The average thickness of the thermal conduction sheet can be determined by measuring the thickness at three spots using a micrometer and taking the arithmetic mean of the measured values.

The thermal conduction sheet may have a protective film on at least one side, and preferably has a protective film on both sides. This allows for protection of an adhesive surface of the thermal conduction sheet.

Examples of the protective film that may be used include a resin film of polyethylene, polyester, polypropylene, polyethylene terephthalate, polyimide, polyether imide, polyether naphthalate or methyl pentene; a coated paper; a coated fabric; and a metallic foil of aluminum. The protective film may be used singly, or two or more kinds thereof may be used in combination to form a multilayered film. It is preferable that the protective film is surface-treated with a releasing agent or the like, such as a silicone-based releasing agent or silica-based released agent.

The thermal conduction sheet according to the disclosure has an elastic modulus of 1.4 MPa or less under a compression stress of 0.1 MPa at 150° C., and a tack strength of 5.0 N·mm or higher at 25° C. It is presumed that, as a result of the elastic modulus and the tack strength satisfying the above ranges, adhesion to a heat generating element and a heat dissipating element can be maintained thereby maintaining the adhesion area in a package in which the amount of warpage is increased.

When the elastic modulus is 1.4 MPa or less under a compression stress of 0.1 MPa at 150° C., excellent flexibility can be obtained, and under the condition of high-temperature pressing for tightly attaching the thermal conduction sheet to a heat generating element and a heat dissipating element, the thermal conduction sheet tends to be easily compressed, and consequently, tends to easily adhere tightly to the heat generating element and the heat dissipating element. Further, the thermal conduction sheet tends to stably maintain tight adhesion to the heat generating element and the heat dissipating element, thereby suppressing the reduction in the adhesion area, even in a semiconductor package in which the amount of warpage that appears after the temperature is returned to normal temperature after the high-temperature pressing is large.

The elastic modulus of the thermal conduction sheet according to the disclosure under a compression stress of 0.1 MPa at 150° C. is preferably 1.4 MPa or less, more preferably 1.3 MPa or less, and still more preferably 1.2 MPa or less. When the aforementioned compressive elastic modulus is 1.2 MPa or less, the adhesiveness is further improved, and the thermal conduction sheet can adjust to warpage more easily. The lower limit of the elastic modulus under a compression stress of 0.1 MPa at 150° C. is not particularly restricted. The aforementioned compressive elastic modulus may be 0.5 MPa or higher, or 0.7 MPa or higher.

The compressive elastic modulus of the thermal conduction sheet can be measured using a compression tester (e.g., INSTRON 5948 MICROTESTER, manufactured by Instron Corporation). A load is applied to the thermal conduction sheet in the thickness direction, and the displacement (mm) and the load (N) are measured. The strain (dimensionless) determined as "displacement (mm)/thickness (mm)" and the stress (MPa) determined as "load (N)/area (mm$^2$)" are plotted as an abscissa and an ordinate, respectively, and the slope at a predetermined stress is defined as a compressive elastic modulus (MPa). Specifically, the compressive elastic modulus can be measured by, for example, the method described below in the Examples section.

The tack strength of the thermal conduction sheet at 25° C. is 5.0 N·mm or higher, preferably 6.0 N·mm or higher, and more preferably 7.0 N·mm or higher. The tack strength of 5.0 N·mm or higher allows suppression of detachment of the thermal conduction sheet from a heat generating element and a heat dissipating element when the gap between the heat generating element and the heat dissipating element is increased due to warpage. The upper limit of the tack strength is not particularly restricted, and the tack strength may be 20.0 N·mm or less, or 15.0 N·mm or less.

The tack strength of the thermal conduction sheet at 25° C. can be measured using a universal physical property tester (e.g., TEXTURE ANALYZER, manufactured by Eko Instruments Co., Ltd.). A probe having a diameter of 7 mm is pressed against the thermal conduction sheet at a load of 40 N at 25° C. (normal temperature) and maintained for 10 seconds, and thereafter the probe is lifted. The tack strength (N·mm) at 25° C. is obtained as an area determined by integrating a load-displacement curve resulting therefrom.

The method of obtaining a thermal conduction sheet that has an elastic modulus of 1.4 MPa or less under a compression stress of 0.1 MPa at 150° C. and a tack strength of 5.0 N·mm or higher at 25° C. is not particularly restricted. For example, such a thermal conduction sheet can be obtained by adjusting the blending ratio of the components used in the thermal conduction sheet.

If the thermal conduction sheet can maintain the adhesion area without being detached from the heat generating element and the heat dissipating element, an increase in thermal contact resistance can be reduced, and deterioration of the heat dissipation property of the entire heat dissipating device can be controlled. Therefore, it is desirable that the adhesion area between a thermal conduction sheet and a heat generating element and a heat dissipating element are maintained even when the heat generating element is warped.

Use of the thermal conduction sheet is not particularly restricted. The thermal conduction sheet according to the disclosure is particularly suitable as a thermal conduction sheet that is interposed between a semiconductor chip and a heat spreader (TIM1; Thermal Interface Material 1), in which case the semiconductor chip corresponds to the heat generating element and the heat spreader corresponds to the heat dissipating element. In particular, the thermal conduction sheet according to the disclosure is capable of adjusting to warpage, thereby maintaining a sufficient adhesion area with the semiconductor chip and the heat spreader, even when, for example, the amount of warpage fluctuates in conjunction with heating and cooling in a packaging process. Consequently, an excellent heat dissipation can be ensured even in a semiconductor package in which the amount of warpage is increased. The reason for this is not necessarily clear; however, it is presumed as follows. The thermal conduction sheet according to the disclosure has an elastic modulus of 1.4 MPa or less under a compression stress of 0.1 MPa at 150° C., and a tack strength of 5.0 N·mm or higher at 25° C. Due to these properties, when a heat spreader is arranged on a semiconductor chip via the thermal conduction sheet and a high-temperature pressing is performed, it is presumed that the thermal conduction sheet is sufficiently compressed, and further, the thermal conduction sheet can sufficiently adhere to the semiconductor chip and the heat spreader. Consequently, it is presumed that the heat conduction sheet can adjust to warpage and thereby maintain the adhesion area even when the amount of warpage changes during the subsequent cooling.

[Method of Producing Thermal Conduction Sheet]

The method of producing the thermal conduction sheet is not particularly restricted as long as a thermal conduction sheet having the above-described configuration can be obtained. Examples of the method of producing the thermal conduction sheet include the following method.

In an embodiment, the method of producing a thermal conduction sheet includes: a step of preparing a composition that includes graphite particles (A) and optional other component(s) (also referred to as a "preparation step"); a step of obtaining a sheet by forming a sheet from the composition (also referred to as a "sheet preparation step"); forming a laminate of the sheet (also referred to as a "laminate preparation step"); and slicing off a side face of the laminate (also referred to as a "slicing step"). The method of producing the thermal conduction sheet may further include a step of pasting the sliced sheet obtained in the slicing step onto a protective film to laminate the sliced sheet (also referred to as a "lamination step").

By producing a thermal conduction sheet using the above-described method, efficient thermal conduction paths tend to be formed, and consequently, a thermal conduction sheet having a high thermal conductivity and excellent adhesiveness tends to be obtained.

<Preparation Step>

In the preparation step, a composition that contains graphite particles (A) and optional other component(s) (e.g., a component (B) that is a liquid at 25° C., an acrylate-based polymer (C), an ethylene-α-olefin copolymer (D), a hot-melt agent (E), an antioxidant (F), or other component(s)) is prepared. The method of blending these components is not particularly restricted, and any method may be employed as long as the components can be uniformly mixed. A commercially available composition may also be used. With regard to the details of the preparation of the composition, reference can be made to paragraph [0033] of JP-A No. 2008-280496.

<Sheet Preparation Step>

The sheet preparation step is not particularly restricted, and may be performed by any method as long as a sheet can be formed from the composition obtained in the previous step. The sheet production step is preferably performed by, for example, at least one molding method selected from the group consisting of rolling, pressing, extrusion, and coating. With regard to the details of the sheet preparation step, reference can be made to paragraph [0034] of JP-A No. 2008-280496.

<Laminate Preparation Step>

In the laminate preparation step, a laminate of a sheet obtained in the previous step is formed. The laminate may be prepared by, for example, sequentially layering multiple separate sheets, may be prepared by folding a single sheet, or may be prepared by winding a single sheet. With regard to the details of the laminate preparation step, reference can be made to paragraphs [0035] to [0037] of JP-A No. 2008-280496.

<Slicing Step>

The slicing step is not particularly restricted, and may be performed by any method as long as a side face of the laminate can be sliced off. From the viewpoint of forming extremely efficient thermal conduction paths by the graphite particles (A) penetrating through the thermal conduction sheet in the thickness direction thereby further improving the thermal conductivity, it is preferable that the side face of the laminate is sliced off in a thickness of less than twice the mass-average particle size of the graphite particles (A). With regard to the details of the slicing step, reference can be made to paragraph [0038] of JP-A No. 2008-280496.

<Lamination Step>

The lamination step is not particularly restricted, and may be performed by any method as long as the sliced sheet obtained in the slicing step can be pasted onto a protective film.

[Heat Dissipating Device]

A heat dissipating device according to the disclosure is configured such that the thermal conduction sheet according to the disclosure is arranged between a heat generating element and a heat dissipating element. Examples of the heat generating element include a semiconductor chip, a semiconductor package, and a power module. Examples of the heat dissipating element include a heat spreader, a heat sink, and a water cooling pipe.

An example of the heat dissipating device will be described below in more detail referring to FIG. 1. A thermal conduction sheet 1 is used with one side thereof being tightly adhered to a semiconductor chip 2 (heat generating element) and the other side tightly adhered to a heat spreader 3 (heat dissipating element). The semiconductor chip 2 (heat generating element) is fixed to a substrate 4 using an underfill material 5 while the heat spreader 3 (heat dissipating element) is fixed to the substrate 4 using a seal material 6. The adhesion between the thermal conduction sheet 1 and the semiconductor chip 2 and between the thermal conduction sheet 1 and the heat spreader 3 is tightened by pressing. It is noted that the number of heat generating element(s) and the number of heat dissipating element (s), respectively, with respect to one thermal conduction sheet 1 is not necessarily one. For example, plural semiconductor chips 2 (heat generating elements) may be provided to a single thermal conduction sheet 1, or a single semiconductor chip 2 (heat generating element) may be provided to plural thermal conduction sheets 1, or plural semiconductor chips 2 (heat generating elements) may be provided to plural thermal conduction sheets 1.

The heat dissipating device is configured such that the thermal conduction sheet according to the disclosure is arranged between a heat generating element and a heat dissipating element. By stacking a heat generating element and a heat dissipating element in layers with the thermal conduction sheet arranged therebetween, the heat generated from the heat generating element can be efficiently transferred to the heat dissipating element. If the heat can be efficiently transferred, the service life of the heat dissipating device can be prolonged, achieving a heat dissipating device that functions stably for long-term use.

The thermal conduction sheet can be particularly preferably used in a temperature range of, for example, from −10° C. to 150° C. Accordingly, preferable examples of the heat generating element include a semiconductor package, a display, an LED, an electric lamp, a power module for an automobile, and an industrial power module.

Examples of the heat dissipating element include: a heat sink that utilizes a fin, a plate or the like made of aluminum or copper; an aluminum or copper block connected to a heat pipe; an aluminum or copper block in which a cooling liquid is circulated using a pump; a Peltier element; and an aluminum or copper block that includes a Peltier element.

The heat dissipating device is configured by bringing the respective sides of the thermal conduction sheet into contact with a heat generating element and a heat dissipating element. The method of bringing the heat generating element and one side of the thermal conduction sheet into contact with each other and the method of bringing the heat dissipating element and the other side of the thermal conduction sheet into contact with each other are not particularly restricted as long as they can be fixed while being sufficiently adhered to each other.

Examples include a method of arranging the thermal conduction sheet between a heat generating element and a heat dissipating element, fixing them using a jig capable of applying a pressure of approximately 0.05 MPa to 1 MPa, and either allowing the heat generating element to generate heat, or heating them to approximately 80° C. to 180° C. in an oven or the like. Alternatively, a method of using a press machine capable of heating at a temperature of from 80° C. to 180° C. and applying a pressure of from 0.05 MPa to 1 MPa may also be employed. In this method, the pressure is preferably in a range of from 0.10 MPa to 1 MPa, and the temperature is preferably in a range of 100° C. to 170° C. By adjusting the pressure to be 0.10 MPa or higher or the heating temperature to be 100° C. or higher, excellent adhesion tends to be obtained. Meanwhile, by adjusting the pressure to be 1 MPa or lower or the heating temperature to be 180° C. or lower, the reliability of the adhesion tends to be further improved. This is presumably because reductions in the thickness of the thermal conduction sheet due to excessive compression, or excessive increases in the strain or the residual stress of surrounding members can be suppressed.

The ratio of the reduced thickness of the thermal conduction sheet after being press-bonded with respect to the initial thickness of the thermal conduction sheet before being arranged between the heat generating element and the heat dissipating element and press-bonded (compression ratio) may be from 1% to 35%.

For the fixation, a jig, such as a clip as well as a screw or a spring, may be used. It is preferable that the members are further fixed by a common means, such as an adhesive agent, from the viewpoint of maintaining the adhesion.

Figure 2:
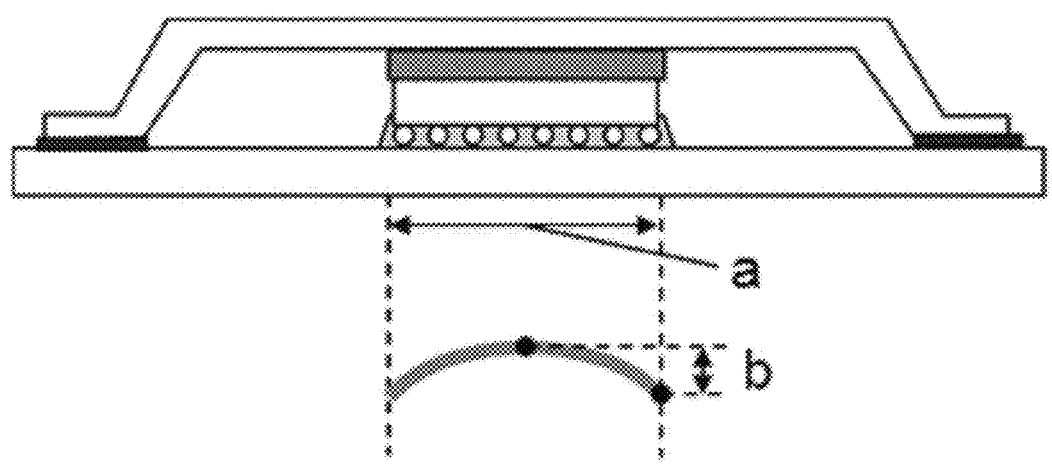
FIG. 2 is a schematic drawing which describes the amount of warpage in a heat dissipating device according to one embodiment of the invention, in which the heat generating element is a semiconductor chip, and the heat dissipating element is a heat spreader.

The amount of warpage, in a case in which the thermal conduction sheet according to the disclosure is used as a TIM1, will be described below with reference to FIG. 2. The area of the analysis of the warpage is the chip area "a" viewed from the substrate. Displacements within the chip area "a" are measured, and the difference between the displacement at the edge of the area "a" and the displacement at the center of the area "a" is defined as an amount of warpage "b". An amount of warpage that may be contemplated in the disclosure is 60 μm to 120 μm, and the greater the amount of warpage is, the more susceptible the thermal conduction sheet is to be detached from the semiconductor chip and a heat spreader, which are a heat generating element and a heat dissipating element, respectively, during the occurrence of warpage. The present disclosure is related to providing a thermal conduction sheet that is capable of maintaining an adhesion area without being detached, even in a semiconductor in which the amount of warpage is 60 μm or greater.

EXAMPLES

The invention will be described in detail below by way of Examples. However, the invention is not limited to these Examples. In the following Examples, the compressive elastic modulus, the tack strength, the thermal resistance and the adhesion area were evaluated by the following respective methods.

(Measurement of Compressive Elastic Modulus)

A compression tester equipped with a thermostat chamber (e.g., INSTRON 5948 MICROTESTER, manufactured by Instron Corporation) was used for the measurement. A thermal conduction sheet of interest was cut out into a circular shape of 14 mm in diameter for testing. The thermal conduction sheet was arranged between two pieces of 0.1 mm-thick paper (release paper), and a load was applied to the thermal conduction sheet in the thickness direction at a displacement rate of 0.1 mm/min in the thermostat chamber at a temperature of 150° C., during which the displacement (mm) and the load (N) were measured. The strain (dimensionless), which is obtained as "displacement (mm)/thickness (mm)", and the stress (MPa), which is obtained as "load (N)/area (mm$^2$)", were plotted as an abscissa and an ordinate, respectively, and the slope at a stress of 0.1 MPa was defined as the compressive elastic modulus (MPa).

(Measurement of Tack Strength)

Using a universal physical property tester (TEXTURE ANALYZER, manufactured by Eko Instruments Co., Ltd.), a probe having a diameter of 7 mm was pressed against the thermal conduction sheet at a load of 40 N at 25° C. (normal temperature) and maintained for 10 seconds, and thereafter the probe was lifted. The tack strength (N·mm) was obtained as an area determined by integrating the load-displacement curve resulting therefrom.

(Measurement of Thermal Resistance)

The thermal conduction sheet was cut out into a 10-mm square piece, and was arranged between a transistor (2SC2233) and a copper block, which are a heat generating element and a heat dissipating element, respectively. While the transistor is pressed at a pressure of 0.14 MPa at 80° C., an electric current was applied thereto, and the temperature T1 (° C.) of the transistor and the temperature T2 (° C.) of the copper block were measured. Using the measured values and the applied electric power W1 (W), a thermal resistance value X (K·cm$^2$/W) per unit area (1 cm$^2$) was calculated as follows:

$$X = (T1 - T2) \times 1/W1$$

(Adhesion Area Evaluation Test)

In order to evaluate the adjustability to warpage of a package, a simple package was prepared and used for the adhesion area evaluation test. MCL-E-700G® (0.81 mm, manufactured by Hitachi Chemical Co., Ltd.) was used as a substrate; CEL-C-3730N-2 (manufactured by Hitachi Chemical Co., Ltd.) was used as an underfill material; and a silicone-based adhesive (SE4450, manufactured by Dow Corning Toray Co., Ltd.) was used as a sealing material. Further, as a heat spreader, a 1 mm-thick copper plate having a nickel plating on the surface was used. The substrate and the heat spreader had a size of 45 mm square; a semiconductor chip had a size of 20 mm square; and the substrate warpage of the assembled package in the chip area was from 60 μm to 75 μn.

The amount of warpage was measured using a 3D thermal surface profiler (THERMOIRÉ PS200, manufactured by Akrometrix, LLC). The amount of warpage of the substrate in the chip area (20 mm×20 mm) was measured.

The package was assembled as follows. A 0.3 mm-thick thermal conduction sheet was cut out into a 30-mm square piece and was pasted onto the heat spreader, and the members were hot-pressed for 3 minutes at a load of 46 N and a hot plate temperature of 150° C. using a high-precision pressure thermal bonding apparatus (HTB-MM, manufactured by Alpha-Design Co., Ltd.). Subsequently, the members were treated in a 150° C. incubator for 2 hours to completely cure the sealing material.

The adhesion area was evaluated as follows. Using an ultrasonic imaging diagnostic apparatus (INSIGHT 300, manufactured by Insight Co., Ltd.), the state of adhesion was observed at 35 MHz by a reflection method. The obtained image was binarized using an image analysis software (ImageJ), and the ratio of the adhered area in the 20 mm-square chip portion was determined as the adhesion area (%).

Examples 1 to 4

The below-described materials were fed into a kneader (Model DS3-SGHM-E double-arm pressure kneader, manufactured by Moriyama Ltd.) at the mixing ratios (% by volume) shown in Table 1, and were kneaded at a temperature of 150° C. to obtain each composition.

<Graphite Particles (A)>
(A)-1: flake-shaped expandable graphite particles ("HGF-L" manufactured by Hitachi Chemical Co., Ltd., mass-average particle size: 270 μm; it was confirmed, by the method based on X-ray diffraction analysis described above, that the six-membered ring planes in a crystal were oriented in the planar direction of the flake-shaped particles.)

<Liquid Component (B)>
(B)-1: isobutene-n-butene copolymer ("NOF Polybutene™ EMAWET (registered trademark), Grade 3N", manufactured by NOF Corporation)

(B)-2: isobutene-n-butene copolymer ("NOF Polybutene™ EMAWET (registered trademark), Grade 30N", manufactured by NOF Corporation)

(B)-3: isobutene homopolymer ("TETRAX 6T", manufactured by ENEOS Corporation)

<Acrylate-Based Polymer (C)>
(C)-1: acrylate copolymer resin (butyl acrylate/ethyl acrylate/acrylonitrile/acrylic acid copolymer, weight-average molecular weight: 530,000, Tg=−39° C.)

<Ethylene-α-Olefin Copolymer (D)>
(D)-1: ethylene-octene elastomer ("EOR 8407", manufactured by The Dow Chemical Company)

(D)-2: ethylene-propylene copolymer ("LUCANT HC-3000X", manufactured by Mitsui Chemicals, Inc.)

<Hot-Melt Agent (E)>
(E)-1: hydrogenated petroleum resin ("ARKON P90", manufactured by Arakawa Chemical Industries, Ltd.)

<Antioxidant (F)>
(F)-1: hindered phenol-based antioxidant ("ADK STAB AO-60", manufactured by ADEKA Corporation)

(Production of Thermal Conduction Sheets)

The kneaded composition was fed into an extrusion molding machine (trade name: HKS40-15 extruder, manufactured by Parker Corporation), and was extruded in the shape of a flat plate having a width of 20 cm and a thickness of from 1.5 mm to 1.6 mm to obtain a primary sheet. The obtained primary sheet was press-punched using a 40 mm×150 mm mold blade. 61 pieces of the punched sheet were layered on one another, to which pressure was applied in the layering direction at 90° C. for 30 minutes using an 80 mm-high spacer such that the height of the layered sheets became 80 mm, whereby a 40 mm×150 mm×80 mm laminate was obtained. Subsequently, a side face of the laminate having dimensions of 80 mm×150 mm, was sliced off using a woodworking slicer to obtain a 0.3 mm-thick thermal conduction sheet.

Comparative Examples 1 to 3

Thermal conduction sheets were each produced by kneading the materials at the mixing ratios (% by volume) shown in Table 1, layering the obtained sheet, and pressing and slicing the laminate in the same manner as in Examples 1 to 4.

TABLE 1

| Classification | | Example 1 | Example 2 | Example 3 | Example 4 | Comparative Example 1 | Comparative Example 2 | Comparative Example 4 |
|---|---|---|---|---|---|---|---|---|
| Component (A) | (A)-1 | 37.3 | 37.3 | 32.3 | 32.3 | 37.3 | 37.3 | 37.1 |
| Component (B) | (B)-1 | 24.3 | — | — | — | — | — | — |
| | (B)-2 | — | 22.1 | 23.9 | 23.9 | 24.3 | 22.1 | — |
| | (B)-3 | 23.7 | 25.3 | — | 13.4 | 23.7 | — | 25.4 |
| Component (C) | (C)-1 | — | — | 26.8 | 13.4 | — | 24.8 | — |
| Component (D) | (D)-1 | — | 3.6 | 3.9 | 3.9 | — | 3.6 | 9.3 |
| | (D)-2 | — | — | — | — | — | — | 21.9 |
| Component (E) | (E)-1 | 14.7 | 11.7 | 12.6 | 12.6 | 14.7 | 11.7 | 5.8 |
| Component (F) | (F)-1 | — | — | 0.5 | 0.5 | — | 0.5 | 0.5 |

(Compressive Elastic Modulus)

As a result of evaluating the compressive elastic modulus of each 0.3 mm-thick thermal conduction sheet in the above-described manner, the compressive elastic modulus (MPa) under a compression stress of 0.1 MPa at 150° C. was as shown in Table 2. The compressive elastic modulus was 1.4 MPa or less in Examples 1 to 4, while the compressive elastic modulus was higher than 1.4 MPa in Comparative Examples 1 to 3.

(Tack Strength)

As a result of evaluating the tack strength of each 0.3 mm-thick thermal conduction sheet in the above-described manner, the tack strength was 5.0 N·mm or higher in Examples 1 to 4. The tack strength was also 5.0 N·mm or higher in Comparative Example 1. However, the tack strength was lower than 5.0 N·mm in Comparative Examples 2 and 3.

(Adhesion Area)

As a result of evaluating each 0.3 mm-thick thermal conduction sheet in accordance with the above-described adhesion area evaluation test, the adhesion areas in Examples 1 to 4 were 90% or larger, indicating that the thermal conduction sheets were able to adjust to warpage and that the adhesion was sufficient. In particular, the thermal conduction sheets of Examples 2 to 4 had an adhesion area of 95% or larger, indicating that the thermal conduction sheets had superior adjustability to warpage. On the other hand, the adhesion areas in Comparative Examples 1 to 3 were from 72% to 76%, and further, it was observed that largely warped four corners of the chip were not adhered to the thermal conduction sheet, causing detachment of the thermal conduction sheet.

(Thermal Resistance)

As a result of evaluating the thermal resistance of each 0.3 mm-thick thermal conduction sheet in the above-described manner, the thermal resistance was found to be from 0.13 K·cm²/W to 0.15 K·cm²/W in Examples 1 to 4 and Comparative Examples 1 to 3, indicating that all of these thermal conduction sheets had low thermal resistance and excellent thermal conductivity.

TABLE 2

| Classification | Example 1 | Example 2 | Example 3 | Example 4 | Comparative Example 1 | Comparative Example 2 | Comparative Example 3 |
|---|---|---|---|---|---|---|---|
| Compressive elastic modulus (MPa) | 1.36 | 1.33 | 1.29 | 1.16 | 1.44 | 1.57 | 1.73 |
| Tack strength (N · mm) | 7.3 | 5.2 | 6.0 | 7.6 | 7.2 | 3.6 | 1.8 |
| Adhesion area (%) | 90 | 97 | 96 | 99 | 72 | 76 | 74 |
| Thermal resistance (K · cm²/W) | 0.14 | 0.14 | 0.14 | 0.14 | 0.15 | 0.14 | 0.13 |

Based on the above, the thermal conduction sheets of Examples 1 to 4, which contained graphite particles (A) and had a compressive elastic modulus of 1.4 MPa or less under a compression stress of 0.1 MPa at 150° C. as well as a tack strength of 5.0 N·mm or higher at 25° C., exhibited excellent adjustability to warpage, along with an adhesion area, which is an indicator of adjustability to warpage, of 90% or larger.

All the documents, patent applications and technical standards that are described in the present specification are hereby incorporated by reference to the same extent as if each individual document, patent application or technical standard is concretely and individually described to be incorporated by reference.

The invention claimed is:

1. A thermal conduction sheet, comprising graphite particles (A) of at least one kind selected from the group consisting of flake-shaped particles, ellipsoidal particles, and rod-shaped particles, wherein:
    when the graphite particles (A) are flake-shaped particles, a planar direction of the graphite particles (A) is oriented in a thickness direction of the thermal conduction sheet,
    when the graphite particles (A) are ellipsoidal particles, a major axis direction of the graphite particles (A) is oriented in the thickness direction of the thermal conduction sheet,
    when the graphite particles (A) are rod-like particles, a longitudinal direction of the graphite particles (A) is oriented in the thickness direction of the thermal conduction sheet,
    the thermal conduction sheet has an elastic modulus of 1.4 MPa or less under a compression stress of 0.1 MPa at 150° C.,
    the thermal conduction sheet has a tack strength of 5.0 N·mm or higher at 25° C., and
    the thermal conduction sheet is obtained by kneading a composition containing the graphite particles (A) and forming the kneaded composition into a sheet, the composition being kneadable at 150° C.

2. The thermal conduction sheet according to claim 1, further comprising a component (B) that is a liquid at 25° C.

3. The thermal conduction sheet according to claim 2, wherein the component (B) that is a liquid at 25° C. comprises a polybutene.

4. The thermal conduction sheet according to claim 1, further comprising an acrylate-based polymer (C).

5. The thermal conduction sheet according to claim 4, wherein the acrylate-based polymer (C) has a glass transition temperature of 20° C. or lower.

6. The thermal conduction sheet according to claim 1, further comprising an ethylene-α-olefin copolymer (D).

7. The thermal conduction sheet according to claim 1, further comprising a hot-melt agent (E).

8. The thermal conduction sheet according to claim 1, further comprising an antioxidant (F).

9. The thermal conduction sheet according to claim 1, wherein the graphite particles (A) comprise flake-shaped particles that comprise expandable graphite particles.

10. The thermal conduction sheet according to claim 1, wherein a content of the graphite particles (A) is from 15% by volume to 50% by volume.

11. A heat dissipating device, comprising:
    a heat generating element;
    a heat dissipating element; and the thermal conduction sheet according to claim 1, which is arranged between the heat generating element and the heat dissipating element.

12. The thermal conduction sheet according to claim 1, wherein the sheet comprises a mixture containing a resin and the graphite particles (A).

13. The thermal conduction sheet according to claim 12, wherein an amount of the graphite particles (A) is 10% by volume or more with respect to the resin.

14. The thermal conduction sheet according to claim 1, wherein the graphite particles (A) comprise ellipsoidal particles.

15. The thermal conduction sheet according to claim 1, wherein the graphite particles (A) comprise rod-shaped particles.

16. The thermal conduction sheet according to claim 2, further comprising an acrylate-based polymer (C).

17. The thermal conduction sheet according to claim 16, wherein the acrylate-based polymer (C) has a glass transition temperature of 20° C. or lower.

18. The thermal conduction sheet according to claim 16, further comprising an ethylene-α-olefin copolymer (D).

19. The thermal conduction sheet according to claim 18, further comprising a hot-melt agent (E).

20. The thermal conduction sheet according to claim 19, further comprising an antioxidant (F).

* * * * *